(12) United States Patent
Todoroki

(10) Patent No.: US 6,408,420 B1
(45) Date of Patent: Jun. 18, 2002

(54) VITERBI DECODING METHOD AND APPARATUS THEREOF

(75) Inventor: Toshiya Todoroki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/352,681

(22) Filed: Jul. 14, 1999

(30) Foreign Application Priority Data

Jul. 17, 1998 (JP) .......................................... 10-203590

(51) Int. Cl.[7] ............................................. H03M 13/03
(52) U.S. Cl. ........................ 714/795; 714/794; 714/796
(58) Field of Search ................................ 714/794–796, 714/792, 789, 774; 375/265, 263, 348, 341, 262; 348/608; 360/46, 51

(56) References Cited

U.S. PATENT DOCUMENTS

| | | | | |
|---|---|---|---|---|
| 5,329,537 A | | 7/1994 | Alard et al. ................. | 714/794 |
| 5,424,882 A | * | 6/1995 | Kazawa ........................ | 360/46 |
| 5,710,756 A | * | 1/1998 | Pasternak et al. ............ | 370/216 |
| 5,710,784 A | * | 1/1998 | Kindred et al. .............. | 375/262 |
| 5,878,060 A | * | 3/1999 | Wakamatsu ................. | 714/795 |
| 5,982,818 A | * | 11/1999 | Krueger et al. ............. | 375/265 |
| 5,987,638 A | * | 11/1999 | Yu et al. ..................... | 714/795 |
| 6,199,191 B1 | * | 3/2001 | Iwata .......................... | 714/795 |
| 6,317,471 B1 | * | 11/2001 | Horigome et al. .......... | 375/341 |

OTHER PUBLICATIONS

NN8812476: IBM Technical Disclosure Bulletin: vol. 31 pp. 476–481, Difference Metric Decoder for Interleaved Biphase Trellis Code; Dec. 1988, US.*

G. David Forney, Jr., [The Viterbi Algorithm], IEEE, vol. 61, No. 3, Mar. 1973.

* cited by examiner

*Primary Examiner*—Albert Decady
*Assistant Examiner*—Guy Lamarre
(74) *Attorney, Agent, or Firm*—Whitham, Curtis & Christofferson, P.C.

(57) ABSTRACT

A Viterbi decoding apparatus decoding packet data, even at the case that next packet data are continuously inputted soon after the existing packet data, can correctly decode the last part of the existing packet data is provided. The Viterbi decoding apparatus provides a selector that switches a receiving clock synchronized with the packet data and a high speed clock being faster than the receiving clock. During the packet data are received, the selector supplies the receiving clock to a branch metric generator, an ACS (add, compare and select) circuit, a path metric register, a path memory and a trace back circuit. After the reception of the packet data is finished, the selector supplies the high speed clock to the branch metric generator, the ACS circuit, the path metric register and the path memory. With this, the Viterbi decoding apparatus of the present invention can decode the last part of the existing packet data correctly and quickly.

8 Claims, 6 Drawing Sheets

INPUT DATA TO CODING APPARATUS

| $i_1$ | $i_2$ | $i_3$ | $i_4$ | ····· | $i_d$ | 0 | 0 |

OUTPUT DATA FROM CODING APPARATUS

P DATA

| $P_1$ | $P_2$ | $P_3$ | $P_4$ | ····· | $P_d$ | $P_{d+1}$ | $P_{d+2}$ |

Q DATA

| $Q_1$ | $Q_2$ | $Q_3$ | $Q_4$ | ····· | $Q_d$ | $Q_{d+1}$ | $Q_{d+2}$ |

| | SOFT DECISION DATA | | |
|---|---|---|---|
| 1 | 1 | 1 | 1 |
| | 1 | 1 | 0 |
| | 1 | 0 | 1 |
| | 1 | 0 | 0 |
| 0 | 0 | 1 | 1 |
| | 0 | 1 | 0 |
| | 0 | 0 | 1 |
| | 0 | 0 | 0 |

PATH MEMORY HAVING MEMORY CAPACITY FOR $m_{f+g}$ TIME OF RING STRUCTURE

VITERBI DECODING METHOD AND APPARATUS THEREOF

BACKGROUND OF THE INVENTION

The present invention relates to a Viterbi decoding method and a Viterbi decoding apparatus in which the Viterbi algorithm being an example of a most likelihood decoding method of convolutional codes is used as an error correction method at the digital transmission. The Viterbi algorithm is described, for example, in Proceeding of IEEE, vol. 61, pp. 268–278, Mar. 1973, by G. D. Forney Jr.

DESCRIPTION OF THE RELATED ART

As a system of a digital transmission, there is a packet communication system in which data to be transmitted is divided into packets of a certain bit length (word length) and which transmits the data in a packet unit. At the packet communication system, at the time when two packets transmitted in sequence are received at a receiving side, the time interval between packets is generally not fixed. In the space communication and the mobile communication for such as a mobile phone, a Viterbi decoding apparatus has been used for the error correction. FIG. 1 is a block diagram showing a conventional Viterbi decoding apparatus. Referring to FIG. 1, the operation of the conventional Viterbi decoding apparatus used in a packet communication system is explained. In this, it is defined that the receiving soft decision P data and Q data are three bits respectively.

The conventional Viterbi decoding apparatus 59 shown in FIG. 1 provides input terminals 41 and 42 to which the receiving soft decision P data and Q data are inputted respectively, a selector 3 which switches the group of the receiving soft decision P data and Q data, and the group of "000" data, a branch metric generator 4 which obtains the metric of the output of the selector 3 by comparing the output of the selector 3 with each transmitting data of a group of transmitting data, a path metric register 6 which stores the accumulated metric of survivor path, an ACS (add, compare and select) circuit 5 which outputs a path metric value of "n" state (n is an integer of two or more) and selecting information (branch value) of "n" state every symbol interval based on the outputs of the branch metric generator 4 and the path metric register 6, a path memory 7 which stores the selecting information of "n" state outputted from the ACS circuit 5 every symbol interval, a most likelihood path state detector 9 which obtains a state number having a maximum path metric from the path metric values of "n" state outputted from the ACS circuit 5 every symbol interval, a trace back circuit 48 which performs a trace back process for the data in the path memory 7 and outputs the obtained result as a decoded data from an output terminal 16, and a control circuit 50 which controls this whole Viterbi decoding apparatus 59. The "000" data inputting to the selector 3 are, after the last part of the packet data are inputted, during the packet data are decoded, the data (terminal data) which makes each circuit in the Viterbi decoding apparatus 59 return to the state before the packet data are inputted. In this, three bit soft decision data are inputted to the Viterbi decoding apparatus 59, therefore the "000" data are composed of three bit binary figure "0".

The ACS circuit 5 outputs the compared and selected path metric value of "n" state and selecting information of "n" state, by adding, comparing and selecting the outputs of the branch metric generator 4 and the path metric register 6, every symbol interval, corresponding to a trellis line diagram. The trace back circuit 48 outputs a path memory control signal to the path memory 7 and reads data from the path memory 7, with this, every "g–f" symbols, traces back the path memory 7 to the past only for "g" symbol from the state number of the output of the most likelihood path state detector 9 and outputs "g–f" bits from the finally reached bits as decoded data.

The Viterbi decoding apparatus 59 further provides a receiving clock input terminal 52 to which a receiving clock is inputted and supplied to the branch metric generator 4, the ACS circuit 5, the path metric register 6, the path memory 7 and the trace back circuit 48, an input terminal 54 which a packet data starting pulse is inputted to and supplies the pulse to the control circuit 50 and an input terminal 55 which a packet data finishing pulse is inputted to and supplies the pulse to the control circuit 50. The control circuit 50 outputs a select signal to the selector 3, and outputs a path metric set signal to the path metric register 6 and outputs a trace back starting signal to the trace back circuit 48. Moreover, the control circuit 50 gives a high path metric to the state number "0" of the path metric register 6 and gives the same low path metric, for example "0", to the other state numbers by the packet data starting pulse and makes the Viterbi decoding operate. After the packet data finishing pulse is inputted, the control circuit 50 switches the output of the selector 3 to the data group "000", during the Viterbi decoding is operated and at the time when the output of the most likelihood path state detector 9 becomes the state number "0", the control circuit 50 makes the operation of the branch metric generator 4, the ACS circuit 5, the path metric register 6 and the most likelihood path state detector 9 stop and makes the trace back circuit 48 perform the trace back from the series connecting to the most likelihood path of the state number "0".

Next, the operation of the conventional Viterbi decoding apparatus 59 for the packet data processing is explained. In this, in order to make the explanation understandable, the case that a coding ratio R=1/2 and a constraint length K=3 is explained.

First, a coding apparatus of transmission side using with this Viterbi decoding apparatus is explained. FIG. 2 is a block diagram showing a convolutional coding apparatus. At the transmission side, as shown in FIG. 2, the convolutional coding apparatus 23 is constituted of a three stage shift register 20 and Exclusive-OR gates 21 and 22. And inputted data are coded by this convolutional coding apparatus 23. The series of data is inputted to the shift register 20 from an input terminal 24 every symbol interval. And the output of each stage designated by the shift register 20 is logically operated by the Exclusive-OR gates 21 and 22, and P data and Q data are outputted from output terminals 25 and 26 respectively. The shift register 20 is made to reset by giving a reset signal.

FIG. 3 is a series of data diagram showing a series of transmitted data and a series of convolutionally coded data. As shown in FIG. 3, at the case that the "d" pieces of the packet data $i_1, i_2, \ldots, i_d$ are convolutionally coded, generally the convolutional coding apparatus 23 is made to reset before the data $i_1$ is inputted. That is, the contents of each stage of the shift register 20 are made to be "0". And after the last packet data $i_d$ is inputted to the shift register 20, the "the constraint length K−1" pieces of "0" is inputted. In this, the constraint length K=3, therefore two pieces of "0" data are inputted. In FIG. 3, the P data and Q data outputted from the convolutional coding apparatus 23 are denoted as $P_1, P_2, \ldots, P_d, P_{d+1}, P_{d+2}$ and $Q_1, Q_2, \ldots, Q_d, Q_{d+1}) Q_{d+2}$ respectively.

The P data and Q data being the output of the convolutional coding apparatus 23 are transmitted and inputted to the Viterbi decoding apparatus 59 in FIG. 1. At this time, in order for the Viterbi decoding apparatus 59 to make use of the additional information of the P data and Q data corrupted by noise over the channel, the received P data and Q data are expressed in the soft decision. FIG. 4 is soft decision data diagram showing three bit soft decision data for "0" and "1" data. In FIG. 4, the above mentioned soft decision data are shown.

Next, the operation of the conventional Viterbi decoding apparatus 59 shown in FIG. 1 is explained. FIG. 5 is a trellis diagram showing the trellis expression of the convolutional coding apparatus 23 shown in FIG. 2. In FIG. 5, {0,0}, {0,1},{1,0} and {1,1} show {a,b}, that is, the contents of the first and second stages of the shift register 20 in the convolutional coding apparatus 23 are shown. In this, "a" and "b" are variables expressing the contents of each one bit of the first and second stages of the shift register 20 respectively. The values positioned at the sides of arrow marks placed at the right sides of the {0,0}, {0,1}, {1,0} and {1,1} are the calculated values (a×2+b), and these values are called as state numbers.

The trellis diagram shown in FIG. 5 is briefly explained. At the case that the state number is "0" and the data inputting next to the convolutional coding apparatus 23 is "0", the state number is shifted to "0" and "0 0" is outputted as the output value of the P data and the Q data. And at the case that the state number is "0" and the data inputting next to the convolutional coding apparatus 23 is "1", the state number is shifted to "1", and "1 1" is outputted as the output value of the P data and the Q data. At the case that the state numbers are the other numbers, the shifting destination is determined corresponding to the inputting data to the convolutional coding apparatus 23. The outputting values of the P data and Q data at those times are described at above the line showing the shift. The Viterbi decoding apparatus 59 performs the decoding process corresponding to this trellis diagram.

At the Viterbi decoding apparatus 59, after the packet data starting pulse is inputted to the control circuit 50, the control circuit 50 outputs a path metric set signal to the path metric register 6. The path metric register 6 gives a high metric (for example, 64) to the register of the state number "0", and gives metric "0" to the register of the state numbers "1", "2" and "3". At this time, the control circuit 50 sets a select signal for the selector 3, in order that the selector 3 selects the group of the receiving soft decision P data and Q data and outputs them.

First, after the soft decision data for $P_1$ and $Q_1$ are inputted to the branch metric generator 4 through the selector 3 from the input terminals 41 and 42, the branch metric generator 4 calculates the metric for soft decision $P_1$ data and $Q_1$ data, that is, calculates the branch metric associated with all the branches (0, 0), (1, 0), (0, 1) and (1, 1). For the soft decision $P_1$ data and $Q_1$ data, the branch metric at the time when the branch is (0, 0) is defined as $\lambda_0$, the branch metric at the time when the branch is (1, 0) is defined as $\lambda_1$, the branch metric at the time when the branch is (0, 1) is defined as $\lambda_2$, and the branch metric at the time when the branch is (1, 1) is defined as $\lambda_3$. The branch metric generator 4 outputs these $\lambda_0$, $\lambda_1$, $\lambda_2$ and $\lambda_3$ to the ACS circuit 5. FIG. 6 is a diagram showing an explanation of the ACS circuit. As shown in FIG. 6, at this time, path metric values of each state number 0, 1, 2 and 3 at time $m_0$ are defined as $\Gamma_0(m_0)$, $\Gamma_1(m_0)$, $\Gamma_2(m_0)$ and $\Gamma_3(m_0)$ respectively. Actually, the time is soon after the metric set has been done, therefore each path metric value is $\Gamma_0(m_0)$= 64, $\Gamma_1(m_0)$=0. $\Gamma_2(m_0)$=0 and $\Gamma_3(m_0)$=0.

The path metric register 6 outputs these $\Gamma_0(m_0)$, $\Gamma_1(m_0)$, $\Gamma_2(m_0)$ and $\Gamma_3(m_0)$ to the ACS circuit 5 and the ACS circuit 5 performs the operation based on the trellis shown in FIG. 6.

Next, this operation is explained. At time $m_1$, the shifts merged into the state number "0" are ones from the state number "0" and "2". The output data from the convolutional coding apparatus 23 at the shift from the state number "0" is "0 0", therefore the branch metric becomes $\lambda_0$, and the output data from the convolutional coding apparatus 23 at the shift from the state number "2" is "1 1", therefore the branch metric becomes $\lambda_3$, and the path metric values of the state number "0" and "2" at time $m_0$ are $\Gamma_0(m_0)$ and $\Gamma_2(m_0)$ respectively. Therefore, the operation of $\Gamma_0(m_0)+\lambda_0$ and $\Gamma_2(m_0)+\lambda_3$ are performed respectively and larger value within these operation is made to be the path metric value $\Gamma_0(m_1)$ at time m1 and at the state number "0", and is stored into the path metric register 6. At the same time, the selected branch value (in FIG. 6, at the case that the value shown as the continuous line is selected, the value is "0", and the value shown as the broken line is selected, the value is "1") is stored as a selected value $S_0(m_1)$ of the state number "0" at time $m_1$ in the path memory 7. Following this, path metric values $\Gamma_1(m_1)$, $\Gamma_2(m_1)$, $\Gamma_3(m_1)$ and branch values $S_1(m_1)$, $S_2(m_1)$, $S_3(m_1)$ at time $m_1$ are calculated and are stored into the path metric register 6 and the path memory 7 respectively. In this, it is defined that the path memory 7 has a memory capacity which can store the branch information for "g+f" symbols. The ACS circuit 5 outputs the path metric values $\Gamma_0(m_1)$, $\Gamma(m_1)$, $\Gamma_2(m_1)$ and $\Gamma_3(m_1)$ calculated at time $m_1$ to the path metric register 6, at the same time also outputs them to the most likelihood path state detector 9. With the mentioned above operation, a series of process at time $m_1$ is finished. Hereinafter this series of process is referred to as an ACS process.

At the time when next soft decision $P_2$ data and $Q_2$ data are inputted, the mentioned above ACS process is repeatedly performed. After finishing the process at time $m_g$, the control circuit 50 gives an instruction that a trace back process mentioning later is performed to the trace back circuit 48 and the most likelihood path state detector 9. The most likelihood path state detector 9 outputs the state number having the maximum path metric value from the most likelihood path metric values $\Gamma_0(m_g)$, $\Gamma_1(m_g)$, $\Gamma_2(m_g)$ and $\Gamma_3(m_g)$ to the trace back circuit 48. FIG. 7 is a trellis diagram showing a trace back process. At the case that the state number having the maximum path metric value at time $m_g$ is "2", the trace back circuit 48 reads the contents of the path memory 7 and traces back the path connecting to the state number "2" having the maximum path metric value at time $m_g$ expressing a continuous line shown in FIG. 7. The trace back circuit 48 examines that the path merging into the state number "2" is whether the state number "1" or "3" by reading out the data stored in the state number "2" at time $m_g$ from the path memory 7, and knows it from the state number "1". This process is traced back to time $m_0$ by the repetition of the same operation. Finally, the trace back circuit 48 outputs the "g−f" pieces of data (data from time $m_1$ to time $m_{g-f}$) from the data read from the path memory 7 as decoded data, from the output terminal 16. Hereinafter this process is referred to as a trace back process. At the time when the trace back process is performed by synchronizing with the receiving clock, the ACS process is performed by synchronizing with the receiving clock. It is defined that the path memory 7 can perform the writing process at the time of the ACS process and the reading process at the time of the trace back process at the same time. FIG. 8 is a diagram showing the structure of a ring memory. As shown in FIG. 8, the path memory 7 is formed as ring structure and has a memory capacity for "g+f" symbols, therefore the over writing to the necessary data by the ACS process can be avoided. After this, at the time when the ACS process for "g–f" symbols is performed, the trace back process is performed and the decoded data are outputted.

After the last soft decision $P_{d+2}$ data and $Q_{d+2}$ data are inputted from the input terminals 41 and 42 and the ACS process is finished, a packet data finishing pulse is inputted to the control circuit 50. By the input of this pulse, the control circuit 50 sets a select signal for the selector 3 in order that the group of "000" data (terminal data) is outputted from the selector 3. After this, the group of "000" data of at least for "g+f" symbols must be continuously inputted, synchronizing with the receiving clock. During this, in order to obtain the last data $i_d$ of the packet, the mentioned above ACS process and trace back process are repeatedly performed. In the mentioned above explanation, the process at the group of "000" data is explained, this comes from that the three bit data are used as the receiving soft decision data. At the case that the two bit data are used as the receiving soft decision data, the group of "00" data must be continuously inputted at least for "g+f" symbols.

Regarding that the group of "000" data must be continuously inputted, for example, this is described in the data book of Viterbi decoding apparatus LSI, model name Q 1900, made by Qualcom Inc. In this data book, there is a description that after the decoding of the packet data is finished, the 103 pieces of "000" data must be inputted.

At the mentioned above conventional Viterbi decoding apparatus, at the time when the decoding of the packet data is processed, after finishing the decoding of the packet data, the "000" data for "g+f" symbols must be absolutely inputted. Therefore, next packet data to be inputted are made to wait for "g+f" symbols and there is a problem that the packet transmission efficiency is deteriorated. And at the case that next packet data are inputted before waiting for "g+f" symbols, there is a problem that the last part of the existing packet data is not decoded correctly.

SUMMARY OF THE INVENTION

It is therefore an object of the present invention to provide a Viterbi decoding method and a Viterbi decoding apparatus, even though at the case that next packet data are continuously inputted after the existing packet data to the Viterbi decoding apparatus, which can decode the last part of the existing packet data correctly.

For achieving the above mentioned objects, at a Viterbi decoding method, which receiving data are inputted to, generates a branch metric from said receiving data, performs a ACS (add, compare and select) process for said branch metric, generates path metric values being plural states and selecting information, stores said selecting information, decides the most likelihood path based on the maximum path metric value, and traces back said stored selecting information based on said decided most likelihood path, and outputs decoded data, said receiving data are packet data. And a Viterbi decoding method includes a process, during said packet data are received, which performs generating said branch metric, said ACS process, deciding said most likelihood path and outputting said decoded data, based on a first operating clock synchronized with said packet data, and a process, at the time when the reception of said packet data is finished, which switches to a second operating clock being faster than said first operating clock, performs generating said branch metric and said ACS process and deciding said most likelihood path, based on said second operating clock.

A first Viterbi decoding apparatus of the present invention provides, a first selector which switches receiving data and terminal data and outputs the selected data, a branch metric generator which the output of said first selector is inputted to and obtains the metric of said inputted data, a path metric register which stores the accumulated metric of the survivor path, an ACS circuit which performs an ACS process based on the output of said branch metric generator and the output of said path metric register every symbol interval and outputs path metric values of plural states and selecting information, a most likelihood path state detector which detects a most likelihood path having the maximum path metric value from said path metric values of plural states, a path memory which stores the selecting information of said plural states every symbol interval, and a trace back circuit which traces back to the past said path memory for only "g" symbol every "g–f" symbols based on said most likelihood path and outputs "g–f" bits from finally reached bits as decoded data, and said receiving data are packet data. And a Viterbi decoding apparatus, selects said packet data by said first selector during said packet data are received and also drives said branch metric generator, said ACS circuit, said path metric register, said path memory and said trace back circuit by a first operating clock synchronized with said packet data, makes said first selector switch to said terminal data side at the time when the reception of said packet data is finished, and drives said branch metric generator, said ACS circuit, said path metric register and said path memory by a second operating clock being faster than said first operating clock after the reception of said packet data is finished.

A second Viterbi decoding apparatus of the present invention, which provides a selector which switches receiving data and terminal data and outputs the selected data, a branch metric generator which the output of said selector is inputted to and obtains the metric of said inputted data, a path metric register which stores the accumulated metric of the survivor path, an ACS circuit which performs an ACS process based on the output of said branch metric generator and the output of said path metric register every symbol interval and outputs path metric values of plural states and selecting information, a most likelihood path state detector which detects a most likelihood path having the maximum path metric value from said path metric values of plural states, a path memory which stores the selecting information of said plural states every symbol interval, and a trace back circuit which traces back to the past said path memory for only "g" symbol every "g–f" symbols based on said most likelihood path and outputs "g–f" bits from finally reached bits as decoded data and said receiving data are packet data. And a Viterbi decoding apparatus, selects said packet data by said selector during said packet data are received and also makes said selector switch to said terminal data side corresponding to that the reception of said packet data is finished and makes said branch metric generator set the branch metric corresponding to said terminal data, wherein said path memory is a ring memory which stores said selecting information of "2f+g" symbols.

A Viterbi decoding apparatus of the present invention processes the last part of the packet data smoothly and correctly, and even next packet data are inputted soon after the existing packet data, the last part of the existing packet data can be decoded correctly. In order to achieve this, at the time when the input of the packet data is finished, the operating clock of the Viterbi decoding apparatus is made to be fast and the process time for the terminal data is made to be reduced. Instead of making the operating clock fast, making the memory capacity of the path memory composed of a ring memory large and with this, the branch metric for the terminal data is known beforehand, therefore it is possible that the branch metric generator sets the branch metric beforehand.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 9:
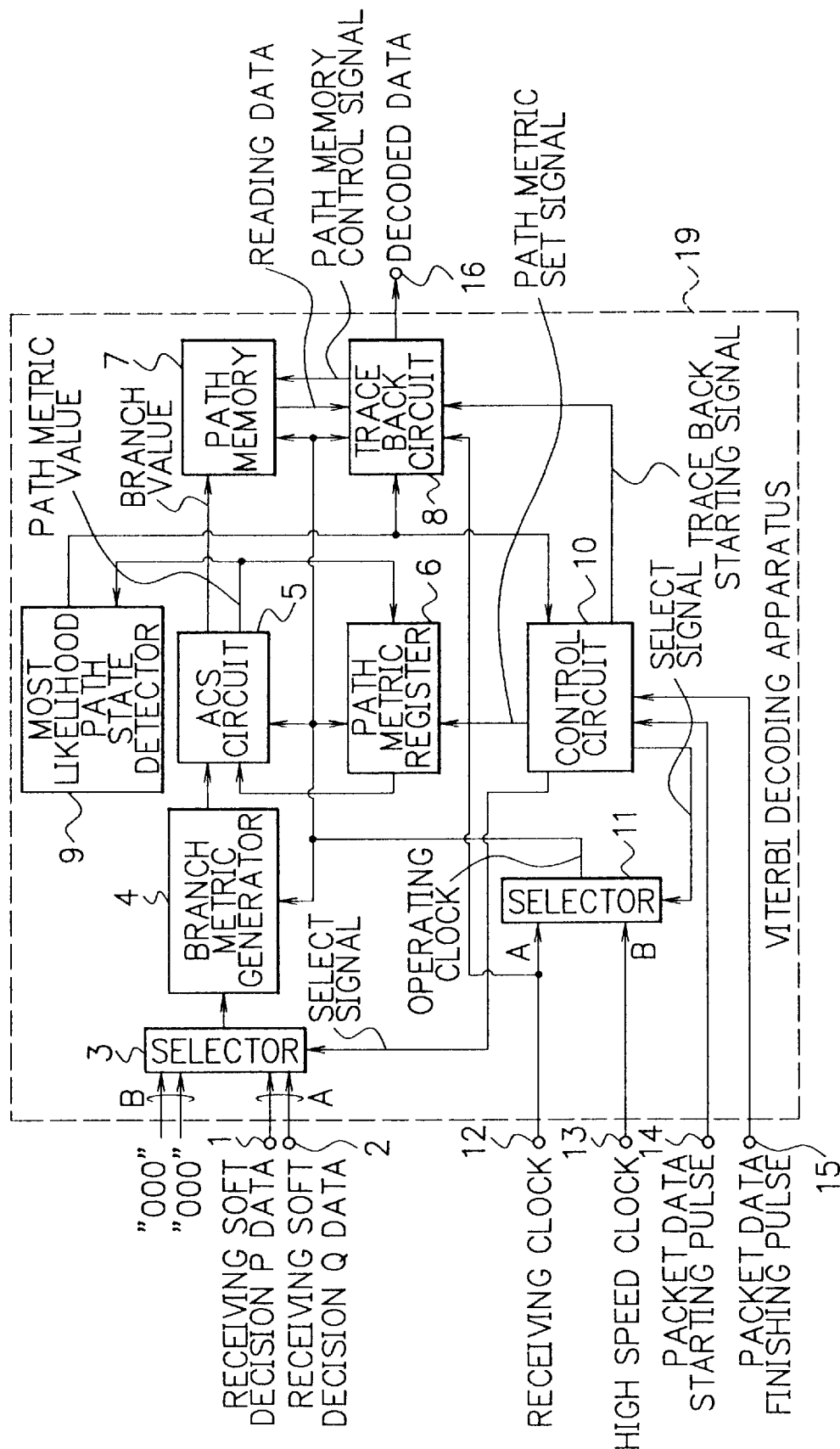
FIG. 9 is a block diagram showing the construction of an embodiment of the present invention.

Referring now to the drawings, embodiments of the present invention are explained in detail. FIG. 9 is a block diagram showing the construction of an embodiment of the present invention. In this, it is defined that receiving soft decision P data and Q data inputting to a Viterbi decoding apparatus are three bits respectively.

This Viterbi decoding apparatus 19 shown in FIG. 9 provides input terminals 1 and 2 to which the receiving soft decision P data and Q data are inputted respectively, a first selector 3 which switches the group of the receiving soft decision P data and Q data, and the group of "000" data (terminal data), a branch metric generator 4 which obtains the metric of the output of the first selector 3 by comparing the output of the first selector 3 with each transmitting data of a group of transmitting data, a path metric register 6 which stores the accumulated metric of survivor path, an ACS (add, compare and select) circuit 5 which outputs a path metric value of "n" state (n is an integer of two or more) and selecting information (branch value) of "n" state every symbol interval based on the outputs of the branch metric generator 4 and the path metric register 6, a path memory 7 which stores the selecting information of "n" state outputted from the ACS circuit 5 every symbol interval, a most likelihood path state detector 9 which obtains a state number having a maximum path metric from the path metric values of "n" state outputted from the ACS circuit 5 every symbol interval, a trace back circuit 8 which performs a trace back process for the data in the path memory 7 and outputs the obtained result as a decoded data from an output terminal 16, and a control circuit 10 which controls this whole Viterbi decoding apparatus 19.

The ACS circuit 5 outputs the compared and selected path metric value of "n" state and selecting information of "n" state, by adding, comparing and selecting the outputs of the branch metric generator 4 and the path metric register 6, every symbol interval, corresponding to a trellis line diagram. The trace back circuit 8 outputs a path memory control signal to the path memory 7 and reads data from the path memory 7, with this, every "g–f" symbol, traces back the path memory 7 to the past only for "g" symbol from the state number of the output of the most likelihood path state detector 9 and outputs "g–f" bits from the finally reached bit as decoded data. In this, the path memory 7 is a memory ring having a memory capacity which can store the state information for "g+f" symbols.

Figure 1:
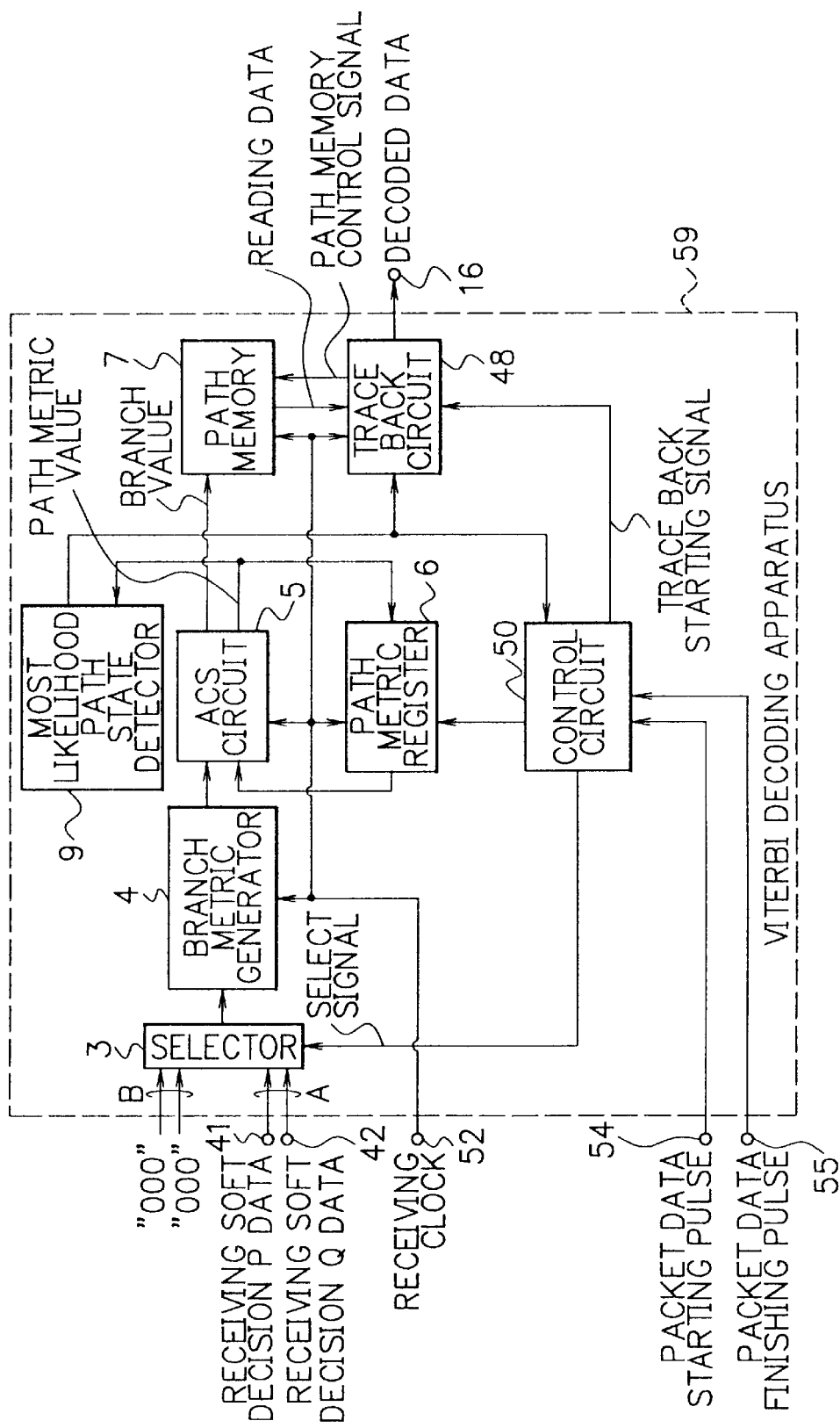
FIG. 1 is a block diagram showing a conventional Viterbi decoding apparatus.

The mentioned above construction of the Viterbi decoding apparatus 19 of the present invention is slightly different from the conventional Viterbi decoding apparatus 59 in FIG. 1, in the construction and function of the control circuit 10, and except that both receiving clock and operating clock are inputted to the trace back circuit 8 of the present invention, the other functions of the present invention are the same as the conventional Viterbi decoding apparatus.

The Viterbi decoding apparatus 19 further provides an input terminal 12 to which a receiving clock is inputted, an input terminal 13 to which a high speed clock being faster than the receiving clock is inputted, a second selector 11 which switches the receiving clock inputted to the input terminal 12 and the high speed clock inputted to the input terminal 13, and outputs the switched result as an operating clock, an input terminal 14 which a packet data starting pulse is inputted to and supplies the pulse to the control circuit 10, and an input terminal 15 which a packet data finishing pulse is inputted to and supplies the pulse to the control circuit 10. At this Viterbi decoding apparatus 19, the operating clock outputting from the second selector 11 is supplied to the branch metric generator 4, the ACS circuit 5, the path metric register 6, the path memory 7 and the trace back circuit 8. The receiving clock inputted to the input terminal 12 is directly supplied to the trace back circuit 8. In this, the receiving clock corresponds to a first operating clock and the high speed clock corresponds to a second operating clock.

The control circuit 10 outputs a first select signal to the first selector 3 and outputs a second select signal to the second selector 11, and outputs a path metric set signal to the path metric register 6 and outputs a trace back starting signal to the trace back circuit 8. At the usual time, the second select signal is outputted in order that the second selector 11 selects the receiving clock. The control circuit 10, by the packet data starting pulse, outputs the first select signal to the first selector 3 in order that the first selector 3 selects the input terminals 1 and 2, and gives a high path metric to the state number "0" of the path metric register 6, and gives the same low path metric, for example, "0" to the other state numbers, and controls to operate the Viterbi decoding. After the packet data finishing pulse is inputted, the control circuit 10 sets the first select signal and the second select signal in order that the first selector 3 selects the group of "000" data and the second selector 11 selects the high speed clock. During the Viterbi decoding is operated, at the time when the output of the most likelihood path state detector 9 becomes the state number "0", the control circuit 10 makes the operation of the branch metric generator 4, the ACS circuit 5, the path metric register 6 and the most likelihood path state detector 9 stop and makes the trace back circuit 8 perform the trace back from the series connecting to the most likelihood path of the state number "0".

By the control circuit 10 is set up like this, at this Viterbi decoding apparatus 19, with the input of the packet data finishing pulse, the output of the first selector 3 are switched from the group of the receiving soft decision P data and Q data of each three bits to the group of "000" data being the terminal data and the output (operating clock) of the second selector 11 is switched from the receiving clock to the high speed clock. As a result, the branch metric generator 4, the ACS circuit 5, the path metric register 6 and the most likelihood path state detector 9 become to be operated by the high speed clock. The most likelihood path state detector 9, every one cycle of the high speed clock, examines at which state number the most likelihood path exists at present. The control circuit 10, at the time when the most likelihood path becomes the state number "0", makes the operation of the branch metric generator 4, the ACS circuit 5, the path metric register 6 and the most likelihood path state detector 9 stop, and reads the series connecting to the most likelihood path of the state number "0" from the data stored in the path memory 7 by using the trace back circuit 8 and outputs the read data as the decoded data.

With the mentioned above operation, at this Viterbi decoding apparatus 19, the Viterbi decoding process after the packet data are finished can be speedy operated. Even at the case that next packet data are inputted to the Viterbi decoding apparatus soon after this packet data, the last part of this packet data can be decoded correctly.

The operation of this Viterbi decoding apparatus 19 is explained in detail. In this, in order to make the explanation understandable, the case that a coding ratio R=½ and a constraint length K=3 is explained.

Figures 2, 3, 4:
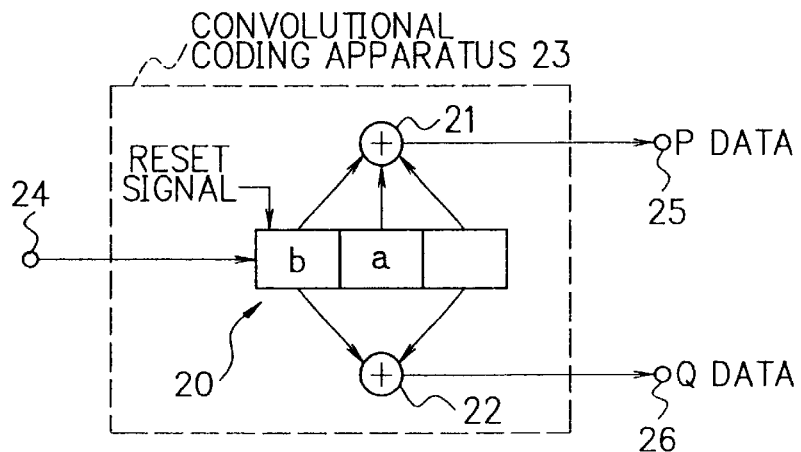
FIG. 2 is a block diagram showing a convolutional coding apparatus.
FIG. 3 is a series of data diagram showing a series of transmitted data and a series of convolutionally coded data.
FIG. 4 is soft decision data diagram showing three bit soft decision data for "0" and "1" data.
Figure 5:
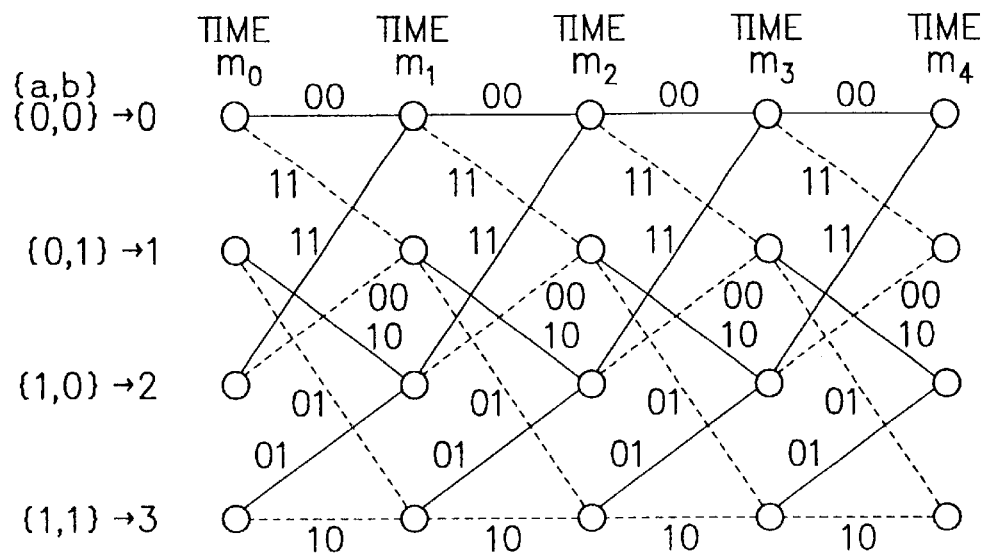
FIG. 5 is a trellis diagram showing the trellis expression of the convolutional coding apparatus shown in FIG. 2.

A coding apparatus of transmission side using with this Viterbi decoding apparatus 19 is the same as that explained at the conventional technology shown in FIG. 2. As explained at the conventional technology, the "d" pieces of the packet data $i_1, i_2, \ldots, i_d$ are convolutionally coded, as shown in FIG. 3. At the case that these packet data are coded, generally the convolutional coding apparatus 23 is made to reset before the data $i_1$ are inputted, and after the terminal packet data $i_d$ are inputted to the shift register 20, the "the constraint length K−1" pieces of "0" is inputted. In this, the constraint length K=3, therefore two pieces of "0" data are inputted. The P data and Q data outputted from the convolutional coding apparatus 23 are denoted as $P_1, P_2, \ldots, P_d, P_{d+1}, P_{d+2}$ and $Q_1, Q_2, \ldots, Q_d, Q_{d+1}, Q_{d+2}$ respectively. The P data and Q data being the output of the convolutional coding apparatus 23 are transmitted and expressed in soft decision as the same as the conventional technology and inputted to the Viterbi decoding apparatus 19. In FIG. 4, for "0" and "1" data, the soft decision data expressed in three bits are shown. And the trellis expression of the convolutional coding apparatus 23 of the transmission side is the same as the conventional technology explained at FIG. 5, the Viterbi decoding apparatus 19 performs the decoding process corresponding to the trellis expression shown in FIG. 5.

At the Viterbi decoding apparatus 19, after the packet data starting pulse is inputted to the control circuit 10, the control circuit 10 outputs a path metric set signal to the path metric register 6. The path metric register 6 gives a high metric (for example, 64) to the register of the state number "0", and gives metric "0" to the register of the state numbers "1", "2" and "3". At this time, the control circuit 10 sets a first select signal and a second select signal, in order that the output of the first selector 3 becomes the group of the receiving soft decision P data and Q data, and the output of the second selector 11 becomes the receiving clock being the clock synchronized with the receiving soft decision P data and Q data. Therefore, the branch metric generator 4, the ACS circuit 5, the path metric register 6, the path memory 7 and the trace back circuit 8 are operated by that the receiving clock synchronized with the receiving soft decision P data and Q data is made to be the operating clock.

Figure 6:
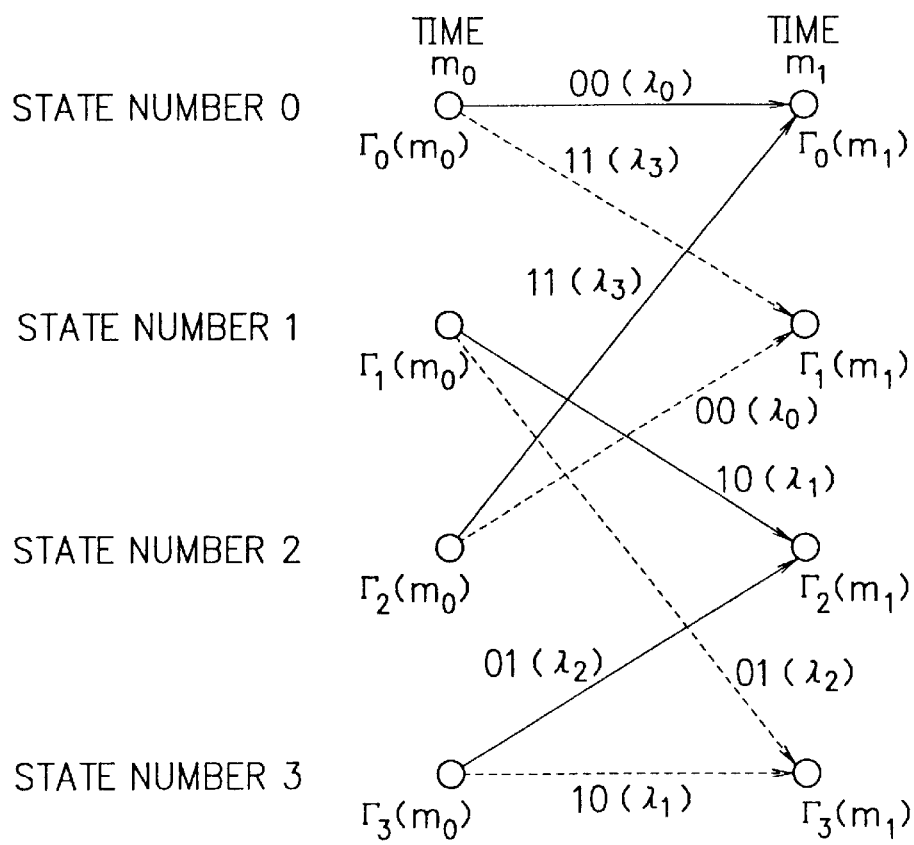
FIG. 6 is a diagram showing an explanation of the ACS circuit.

At this state, after the soft decision data for $P_1$ and $Q_1$ are inputted to the branch metric generator 4 through the selector 3 from the input terminals 1 and 2, the branch metric generator 4 calculates the metric for soft decision $P_1$ data and $Q_1$ data, that is, calculates the branch metric associated with all the branches (0, 0), (1, 0), (0, 1) and (1, 1). For the soft decision $P_1$ data and $Q_1$ data, the branch metric at the time when the branch is (0, 0) is defined as $\lambda_0$, the branch metric at the time when the branch is (1, 0) is defined as $\lambda_1$, the branch metric at the time when the branch is (0, 1) is defined as $\lambda_2$, and the branch metric at the time when the branch is (1, 1) is defined as $\lambda_3$. The branch metric generator 4 outputs these $\lambda_0, \lambda_1, \lambda_2$ and $\lambda_3$ to the ACS circuit 5. At this time, as shown in FIG. 6, path metric values of each state number 0, 1, 2 and 3 at time $m_0$ are defined as $\Gamma_0(m_0)$, $\Gamma_1(m_0), \Gamma_2(m_0)$ and $\Gamma_3(m_0)$ respectively. Actually, the time is soon after the metric set has been done, each path metric value is $\Gamma_0(m_0)=64, \Gamma_1(m_0)=0, \Gamma_2(m_0)=0$ and $\Gamma_3(m_0)=0$.

The path metric register 6 outputs these $\Gamma_0(m_0), \Gamma_1(m_0), \Gamma_2(m_0)$ and $\Gamma_3(m_0)$ to the ACS circuit 5 and the ACS circuit 5 performs the operation based on the trellis shown in FIG. 6. This process is the same as the ACS process explained at the conventional technology.

At the time when next soft decision $P_2$ data and $Q_2$ data are inputted, the ACS process is performed. And this ACS process is repeatedly performed and after finishing the process at time $m_g$, the control circuit 10 gives an instruction that a trace back process is performed to the trace back circuit 8 and the most likelihood path state detector 9. The trace back process at the Viterbi decoding apparatus is also named to a normal trace back process.

Figure 7:
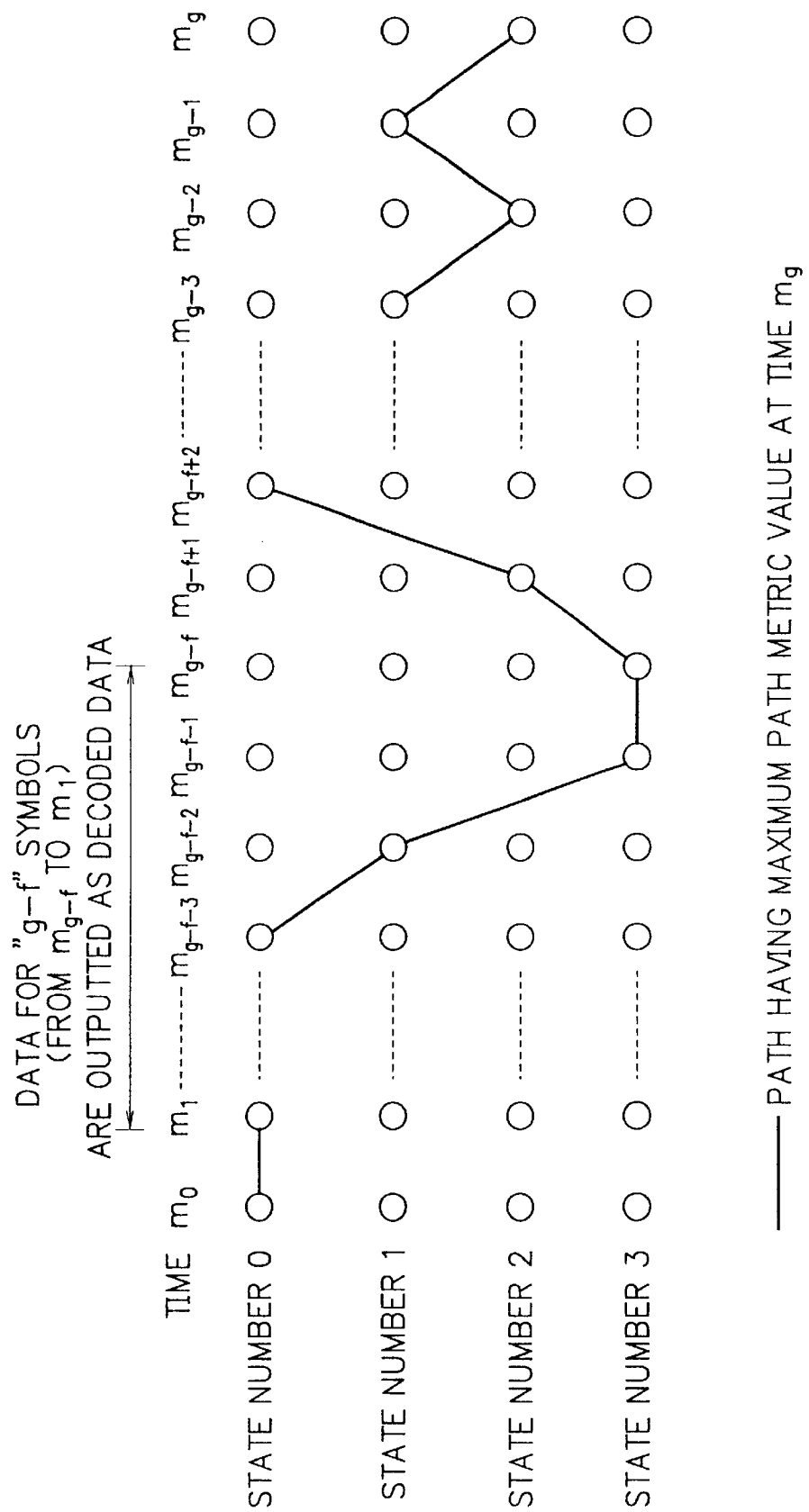
FIG. 7 is a trellis diagram showing a trace back process.
Figure 8:
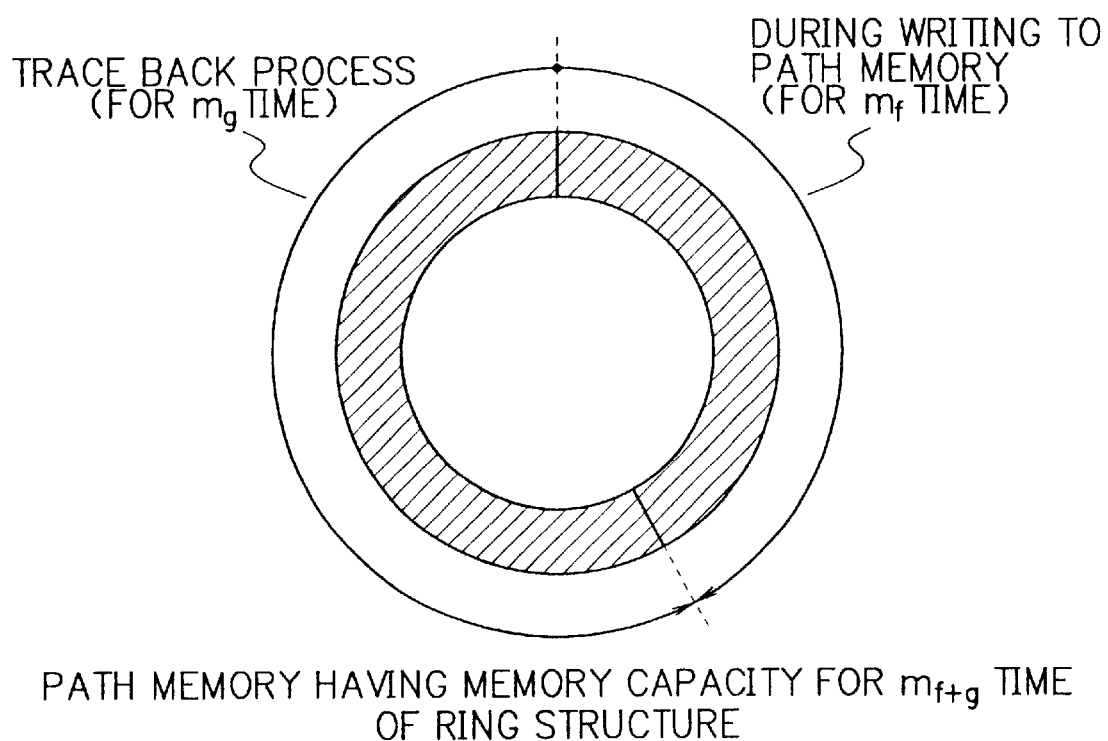
FIG. 8 is a diagram showing the structure of a ring memory.

The instruction to perform the trace back process is given, the most likelihood path state detector 9 outputs the state number having the maximum path metric value from the most likelihood path metric values $\Gamma_0(m_g), \Gamma_1(m_g), \Gamma_2(m_g)$ and $\Gamma_3(m_g)$ to the trace back circuit 8. At the case that the state number having the maximum path metric value at time $m_g$ is "2", the trace back circuit 8 reads the contents of the path memory 7 and traces back the path connecting to the state number "2" having the maximum path metric value at time $m_g$ expressing a continuous line shown in FIG. 7. The trace back circuit 8 examines that the path merging into the state number "2" is whether the state number "1" or "3" by reading out the data stored in the state number "2" at time $m_g$ from the path memory 7, and knows it from the state number "1". This process is traced back to time $m_0$ by the repetition of the same operation. Finally, the trace back circuit 8 outputs the "g−f" pieces of data (data from time $m_1$ to time $m_{g-f}$) from the data read from the path memory 7 as decoded data, from the output terminal 16. At this time, the second selector 11 selects the receiving clock, therefore this trace back process is performed by synchronizing with the receiving clock. At the time when the trace back process is performed, the mentioned above ACS process is performed by synchronizing with the receiving clock. It is defined that the path memory 7 can perform the writing process at the time of the ACS process and the reading process at the time of the trace back process at the same time. The path memory 7 has a memory capacity for "g+f" symbols, therefore the over writing to the necessary data by the ACS process can be avoided. After this, every time when the ACS process for "g−f" symbols is performed, the trace back process is performed and the decoded data are outputted.

The mentioned above operation is the same as the operation of the conventional Viterbi decoding apparatus.

After the last soft decision $P_{d+2}$ data and $Q_{d+2}$ data are inputted from the input terminals 1 and 2 and the ACS process is finished, a packet data finishing pulse is inputted to the control circuit 10 via the input terminal 15. By the input of this pulse, the control circuit 10 sets a first select signal and a second select signal in order that the group of "000" data is outputted from the first selector 3, and that the second selector 11 outputs the high speed clock inputted from the input terminal 13 as the operating clock. And the control circuit 10, first, examines whether the output of the most likelihood path state detector 9 is the state number "0" or not. At the case that the state number is "0", the high speed trace back process mentioned below is performed.

At the high speed trace back process, by using the high speed clock outputting from the second selector 11 as the operating clock, from the state number "0" at time $m_{d+2}$ (time $m_{d+2}$ is time that $P_{d+2}$ and $Q_{d+2}$ are inputted), until before the time when the normal trace back process is finally performed and the decoded data are outputted at right before the packet data finishing pulse is inputted, the trace back operation is performed by reading the data stored in the path memory 7, and the whole data obtained by the trace back process are outputted from the output terminal 16 synchronizing with the receiving clock as decoded data.

In this, if the output of the most likelihood path state detector 9 is not the state number "0", the ACS process is performed for 1 predetermined time. At this time, the group of the soft decision P data and Q data inputting to the branch metric generator 4 is "000". After the ACS process is performed, the control circuit 10 examines again whether the output of the most likelihood path state detector 9 is the state number "0" or not. If the state number is "0", the mentioned above high speed trace back process is performed, and if the state number is not "0", again the ACS process is performed for 1 predetermined time. This operation is repeatedly performed until the state number of the maximum path metric is judged as "0". The control circuit 10, at the time when the output of the most likelihood path state detector 9 shows the state number "0", performs the high speed trace back process and obtains the whole decoded data.

At the case that the packet data finishing pulse is inputted to the control circuit 10 during the normal trace back process is performed, the normal trace back process is temporarily stopped and at the time when the operating clock is switched to the high speed clock, again the normal trace back process is performed and the process is made to finish quickly. After this, the control circuit 10 performs the examining process whether the most likelihood path state detector 9 is the state number "0" or not.

As explained above, at this Viterbi decoding apparatus 19, at the time when the packet data finishing pulse is inputted to the control circuit 10, the output of the first selector 3 switches from the group of the receiving soft decision of P data and Q data of each three bits to the group of "000" data, and the output of the second selector 11 switches from the receiving clock to the high speed clock. As the result, the branch metric generator 4, the ACS circuit 5, the path metric register 6, the path memory 7 and the most likelihood path state detector 9 are operated by the high speed clock being faster than the receiving clock. The most likelihood path state detector 9 examines in which state number the most likelihood path exists at present every one cycle of the high speed clock. And at the time when the most likelihood path becomes the state number "0", the control circuit 10 makes the operation of the branch metric generator 4, the ACS circuit 5, the path metric register 6 and the most likelihood path state detector 9 stop and makes the high speed trace back process perform by using the trace back circuit 8. With this, a series connecting to the most likelihood path of the state number "0" is read from the data stored in the path memory 7 and is outputted as the decoded data. By this operation of the high speed clock, the Viterbi decoding process after the packet data is processed can be quickly processed.

Therefore, this Viterbi decoding apparatus 19, for example, at the case that this apparatus is used at the error correction for the packet communication in the field of the mobile communication such as the space communication and the mobile phone, can smoothly decode the last part of the packet data. Even at the case that next packet data are inputted soon after the existing data, the last part of the existing packet data can be correctly decoded.

Next, another embodiment of the present invention is explained. At the Viterbi decoding apparatus 19 in the mentioned above embodiment, the operating clock is switched from the receiving clock to the high speed clock at the time when the packet data finishing pulse is inputted. However, even at the case that the process is performed by using the receiving clock not switching to the high speed clock and next packet data are continuously inputted soon after the existing packet data, it is possible that the last part of the existing packet data can be correctly decoded. At the case that the process is performed by using the receiving clock, the branch metric for "000" data is known, therefore at the conventional Viterbi decoding apparatus shown in FIG. 1, the branch metric generator 4 sets $\lambda_0$, $\lambda_1$, $\lambda_2$ and $\lambda_3$ beforehand, and the memory capacity of the path memory 7 is made to increase from "g+f" symbols to "2f+g" symbols, with this, this becomes possible. The ACS circuit 5, the path metric register 6 and the most likelihood path state detector 9 is the same as those of the conventional Viterbi decoding apparatus 59 shown in FIG. 1. With this, at the time when the operating clock of the Viterbi decoding apparatus is made to remain the receiving clock, even at the case that the transmission rate of the packet data is large, the Viterbi decoding can be correctly performed.

As explained above, the present invention makes the operating clock of the Viterbi decoding apparatus fast at the time when the input of the packet data is finished, with this, makes the process time of the terminal data reduce. Or the present invention makes the capacity of the path memory composed of a ring memory large and in addition this the branch metric for the terminal data is known beforehand, therefore the branch metric generator sets the branch metric beforehand. With this, the last part of the packet data can be processed smoothly and quickly. Consequently, even next packet data are inputted to the Viterbi decoding apparatus soon after the existing packet data, the last part of the existing packet data can be correctly decoded.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A Viterbi decoding method, which receiving data are inputted to, generates a branch metric from said receiving data, performs a ACS (add, compare and select) process for said branch metric, generates path metric values being plural states and selecting information, stores said selecting information, decides the most likelihood path based on the maximum path metric value, and traces back said stored selecting information based on said decided most likelihood path, and outputs decoded data, wherein:

said receiving data are packet data, and comprising:

a process, during said packet data are received, which performs generating said branch metric, said ACS process, deciding said most likelihood path and outputting said decoded data, based on a first operating clock synchronized with said packet data, and a process, at the time when the reception of said packet data is finished, which switches to a second operating clock being faster than said first operating clock, performs generating said branch metric and said ACS process and deciding said most likelihood path, based on said second operating clock.

2. A Viterbi decoding method in accordance with claim 1, comprising:

a process, at the time when the reception of said packet data is finished, which inputs terminal data after said receiving data.

3. A Viterbi decoding method in accordance with claim 2, comprising:

a process, after the reception of said packet data is finished, examines whether the most likelihood path at the time merges into the state number "0" or not every one cycle of said second operating clock and traces back to the past the selecting information of the series connecting to said most likelihood path at the time when the most likelihood path merges into the state number "0" and outputs the decoded data.

4. A Viterbi decoding apparatus, comprising:

a first selector which switches receiving data and terminal data and outputs the selected data;

a branch metric generator which the output of said first selector is inputted to and obtains the metric of said inputted data;

a path metric register which stores the accumulated metric of the survivor path;

an ACS circuit which performs an ACS process based on the output of said branch metric generator and the output of said path metric register every symbol interval and outputs path metric values of plural states and selecting information;

a most likelihood path state detector which detects a most likelihood path having the maximum path metric value from said path metric values of plural states;

a path memory which stores the selecting information of said plural states every symbol interval; and a trace back circuit which traces back to the past said path memory for only "g" symbol every "g–f" symbols based on said most likelihood path and outputs "g–f" bits from finally reached bits as decoded data, wherein said receiving data are packet data, and a Viterbi decoding apparatus, selects said packet data by said first selector during said packet data are received and also drives said branch metric generator, said ACS circuit, said path metric register, said path memory and said trace back circuit by a first operating clock synchronized with said packet data;

makes said first selector switch to said terminal data side at the time when the reception of said packet data is finished; and drives said branch metric generator, said ACS circuit, said path metric register and said path memory by a second operating clock being faster than said first operating clock after the reception of said packet data is finished.

5. A Viterbi decoding apparatus in accordance with claim 4, further comprising:

a second selector which switches said first operating clock and said second operating clock;

a control circuit which controls said first selector and said second selector in order that said first selector selects said receiving data and said second selector selects said first operating clock corresponding to the input of a packet data starting pulse, and said first selector selects said terminal data and said second selector selects said second operating clock corresponding to the input of a packet data finishing pulse.

6. A Viterbi decoding apparatus in accordance with claim 4, wherein:

said path memory is a ring memory which stores said selecting information for "g+f" symbols.

7. A Viterbi decoding apparatus in accordance with claim 4, wherein:

said most likelihood path state detector, after the reception of said packet data is finished, examines whether the most likelihood path at the time merges into the state number "0" or not every one cycle of said second operating clock, and at the time when the most likelihood path merges into the state number "0", said trace back circuit traces back to the past the selecting information of the series connecting to said most likelihood path and outputs the decoded data.

8. A Viterbi decoding apparatus, which provides a selector which switches receiving data and terminal data and outputs the selected data, a branch metric generator which the output of said selector is inputted to and obtains the metric of said inputted data, a path metric register which stores the accumulated metric of the survivor path, an ACS circuit which performs an ACS process based on the output of said branch metric generator and the output of said path metric register every symbol interval and outputs path metric values of plural states and selecting information, a most likelihood path state detector which detects a most likelihood path having the maximum path metric value from said path metric values of plural states, a path memory which stores the selecting information of said plural states every symbol interval, and a trace back circuit which traces back to the past said path memory for only "g" symbol every "g–f" symbols based on said most likelihood path and outputs "g–f" bits from finally reached bits as decoded data, wherein said receiving data are packet data, and a Viterbi decoding apparatus, selects said packet data by said selector during said packet data are received and also makes said selector switch to said terminal data side corresponding to that the reception of said packet data is finished and makes said branch metric generator set the branch metric corresponding to said terminal data, wherein said path memory is a ring memory which stores said selecting information of "2f+g" symbols.

* * * * *